United States Patent
Ha et al.

(10) Patent No.: US 10,643,931 B2
(45) Date of Patent: May 5, 2020

(54) SEMICONDUCTOR CHIP, ELECTRONIC DEVICE INCLUDING THE SAME, AND METHOD OF CONNECTING THE SEMICONDUCTOR CHIP TO THE ELECTRONIC DEVICE

(71) Applicant: Samsung Display Co., Ltd., Yongin-si, Gyeonggi-do (KR)

(72) Inventors: Seung Hwa Ha, Yongin-si (KR); Jung Yun Jo, Yongin-si (KR); Byoung Yong Kim, Yongin-si (KR); Jeong Do Yang, Yongin-si (KR); Jeong Ho Hwang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/685,640

(22) Filed: Aug. 24, 2017

(65) Prior Publication Data

US 2018/0068931 A1    Mar. 8, 2018

(30) Foreign Application Priority Data

Sep. 2, 2016    (KR) .......................... 10-2016-0113476

(51) Int. Cl.
*H01L 21/44*    (2006.01)
*H01L 23/52*    (2006.01)
(Continued)

(52) U.S. Cl.
CPC .... *H01L 23/4952* (2013.01); *H01L 23/49816* (2013.01); *H01L 24/10* (2013.01); *H01L 24/12* (2013.01)

(58) Field of Classification Search
CPC ............. H01L 21/4853; H01L 21/6835; H01L 23/49816; H01L 24/11; H01L 24/12;
(Continued)

(56) References Cited

U.S. PATENT DOCUMENTS 6,313,540 B1 * 11/2001 Kida ....................... H01L 24/03
257/784
6,365,842 B1 * 4/2002 Jiang ....................... H01L 24/16
174/259

(Continued)

FOREIGN PATENT DOCUMENTS

| KR | 20070092362 A | * | 9/2007 |
| KR | 10-0775121 B1 | | 11/2007 |
| KR | 10-2008-0061969 A | | 7/2008 |

OTHER PUBLICATIONS

Machine translation of KR 20070092362 A.*

*Primary Examiner* — Brian Turner
(74) *Attorney, Agent, or Firm* — Lewis Roca Rothgerber Christie LLP

(57) ABSTRACT

A semiconductor chip includes: a base substrate; a conductive pad on one surface of the base substrate; an insulating layer on the one surface of the base substrate and having an opening exposing a portion of the conductive pad; and a bump on the exposed portion of the conductive pad and on the insulating layer around the opening. The bump includes a plurality of concave portions corresponding to the opening and is arranged in a longitudinal direction of the bump.

11 Claims, 10 Drawing Sheets

(51) Int. Cl.
*H01L 23/528* (2006.01)
*H01L 23/31* (2006.01)
*H01L 23/495* (2006.01)
*H01L 23/00* (2006.01)
*H01L 23/498* (2006.01)

(58) Field of Classification Search
CPC ....... H01L 24/16; H01L 24/81; H01L 21/563; H01L 2224/11003; H01L 2224/13099; H01L 2224/81193; H01L 2224/81801; H01L 2224/83192; H05K 3/3436; H05K 3/3484
See application file for complete search history.

(56) References Cited

U.S. PATENT DOCUMENTS

| | | | |
|---|---|---|---|
| 7,436,062 B2 | 10/2008 | Kainuma et al. | |
| 2001/0051426 A1* | 12/2001 | Pozder | H01L 24/03 438/666 |
| 2002/0043723 A1* | 4/2002 | Shimizu | H01L 23/528 257/758 |
| 2004/0070042 A1* | 4/2004 | Lee | H01L 24/03 257/459 |
| 2006/0060961 A1* | 3/2006 | Lin | H01L 23/3114 257/700 |
| 2007/0001318 A1* | 1/2007 | Starkston | H01L 21/563 257/782 |
| 2008/0054457 A1* | 3/2008 | Lin | H01L 24/13 257/737 |
| 2008/0136019 A1* | 6/2008 | Johnson | H01L 24/03 257/737 |
| 2008/0197173 A1* | 8/2008 | Kitae | H01L 21/4853 228/180.22 |
| 2008/0284009 A1* | 11/2008 | Min | H01L 24/10 257/737 |
| 2009/0168391 A1* | 7/2009 | Saitou | H01L 21/486 361/820 |
| 2009/0230549 A1* | 9/2009 | Lee | H01L 23/49816 257/737 |
| 2009/0230552 A1* | 9/2009 | Pendse | H01L 21/563 257/737 |
| 2009/0243093 A1* | 10/2009 | Chang | H01L 24/10 257/737 |
| 2010/0032802 A1* | 2/2010 | Togawa | H01L 23/642 257/532 |
| 2010/0263913 A1* | 10/2010 | Daubenspeck | H01L 24/03 174/250 |
| 2011/0049725 A1* | 3/2011 | Topacio | H01L 24/03 257/773 |
| 2011/0215467 A1* | 9/2011 | Hsu | H01L 23/498 257/737 |
| 2011/0266666 A1* | 11/2011 | Maeda | H01L 23/3128 257/698 |
| 2012/0178189 A1* | 7/2012 | Reber | H01L 24/05 438/17 |
| 2014/0027900 A1* | 1/2014 | Chiu | H01L 23/562 257/737 |
| 2014/0124920 A1 | 5/2014 | Chuang et al. | |
| 2017/0323863 A1* | 11/2017 | Lee | H01L 23/49811 |
| 2017/0372999 A1* | 12/2017 | Lai | H01L 23/3171 |
| 2018/0033741 A1* | 2/2018 | Dubey | H01L 23/562 |

* cited by examiner

SEMICONDUCTOR CHIP, ELECTRONIC DEVICE INCLUDING THE SAME, AND METHOD OF CONNECTING THE SEMICONDUCTOR CHIP TO THE ELECTRONIC DEVICE

CROSS-REFERENCE TO RELATED APPLICATION

This application claims priority to and the benefit of Korean Patent Application No. 10-2016-0113476, filed on Sep. 2, 2016 in the Korean Intellectual Property Office, the entire content of which is incorporated herein by reference.

BACKGROUND

1. Field

Aspects of embodiments of the present invention relate to a semiconductor chip, an electronic device including the same, and a method of connecting the semiconductor chip to the electronic device.

2. Description of the Related Art

A semiconductor chip may be mounted on (or to) an electronic device by using an anisotropic conductive film (ACF). However, when the semiconductor chip has a fine pitch, a probability that a short or open defect occurs increases. For example, conductive particles included in the ACF may concentrate on connection terminals of the semiconductor chip, for example, side surfaces of bumps, and may cause a short between adjacent bumps or the conductive particles included in the ACF may not be properly arranged in positions at least partially corresponding to the bumps, each having a fine size, such that an open defect may occur.

The semiconductor chip may also be mounted on (or to) the electronic device by using relatively a high-pressure process to secure a low-resistance connection between the semiconductor chip and the electronic device. However, the high-pressure process may cause a crack in the bumps, the connection pads, and/or the wiring lines of the semiconductor chip and/or the electronic device.

SUMMARY

Embodiments of the present invention relate to a semiconductor chip including bumps configured to be easily directly connected to connection pads of an electronic device, an electronic device including the same, and a method of connecting the semiconductor chip to the electronic device.

A semiconductor chip according to an embodiment of the present invention includes: a base substrate; a conductive pad on one surface of the base substrate; an insulating layer on the one surface of the base substrate and having an opening exposing a portion of the conductive pad; and a bump on the exposed portion of the conductive pad and on the insulating layer around the opening. The bump includes a plurality of concave portions corresponding to the opening and being arranged in a longitudinal direction of the bump.

The insulating layer may include a plurality of first openings arranged on one line in the longitudinal direction of the bump.

Each of the first openings may extend in a direction crossing the longitudinal direction of the bump.

The insulating layer may have a second opening extending in the longitudinal direction of the bump in a bump area of the base substrate corresponding to the bump and extending between the first openings.

The bump may include a metal layer.

The semiconductor chip may further include a conductive medium layer between the conductive pad and the bump.

The bump may have a width of 5 µm to 20 µm, and each of the concave portions may have a depth of 1 µm to 4 µm.

The insulating layer may include an inorganic layer and an organic layer.

Each of the concave portions may have a depth corresponding to a height of the insulating layer.

An electronic device according to an embodiment of the present invention includes: a substrate including a plurality of connection pads on the substrate; a semiconductor chip including a plurality of bumps arranged to respectively face the connection pads and electrically connected to the connection pads; and a conductive connection layer between the connection pads and the bumps. The connection pads includes a first metal, the bumps includes a second metal, and the conductive connection layer includes a mixture of the first metal and the second metal.

The semiconductor chip may further include: a base substrate; a plurality of conductive pads arranged to face and respectively correspond to the bumps on one surface of the base substrate and electrically connected to the corresponding bumps; and an insulating layer on the one surface of the base substrate and between the bumps and the conductive pads. The insulating layer may have a plurality of first openings arranged on one line in a longitudinal direction of the bumps.

Each of the first openings may extend in a direction crossing the longitudinal direction of each of the bumps.

The electronic device may further include a display panel including the substrate.

According to an embodiment of the present invention, a method of connecting a semiconductor chip including a plurality of bumps, each of the bumps having a plurality of protrusions and concave portions in a longitudinal direction, to an electronic device including a substrate including a plurality of connection pads corresponding to the bumps includes: arranging the semiconductor chip over the substrate such that the bumps face the connection pads; and connecting the bumps to corresponding ones of the connection pads by applying vibration and pressure to the semiconductor chip.

The connecting of the bumps and the connection pads may include: melting portions of the protrusions and the connection pads by friction by applying ultrasonic vibration to the semiconductor chip; and forming a conductive connection layer comprising a mixture of a metal of the bumps and a metal of the connection pads between the bumps and the connection pads.

According to embodiments of the present invention, a semiconductor chip including bumps having a plurality of concave portions on a surface thereof, an electronic device including the same, and a method of connecting the semiconductor chip to the electronic device are provided. According to embodiments of the present invention, the bumps and connection pads corresponding thereto may be easily directly connected. Therefore, the semiconductor chip may be stably connected to the connection pads of the electronic device without using an anisotropic conductive film (ACF), and the bumps and the connection pads may be easily connected even when using a low-pressure process. In addition, a low-resistance connection between the semiconductor chip and the electronic device may be provided by the direct connection structure.

BRIEF DESCRIPTION OF THE DRAWINGS

In the figures, dimensions may be exaggerated for clarity of illustration. Like reference numerals refer to like elements throughout.

DETAILED DESCRIPTION

Figure 1A:
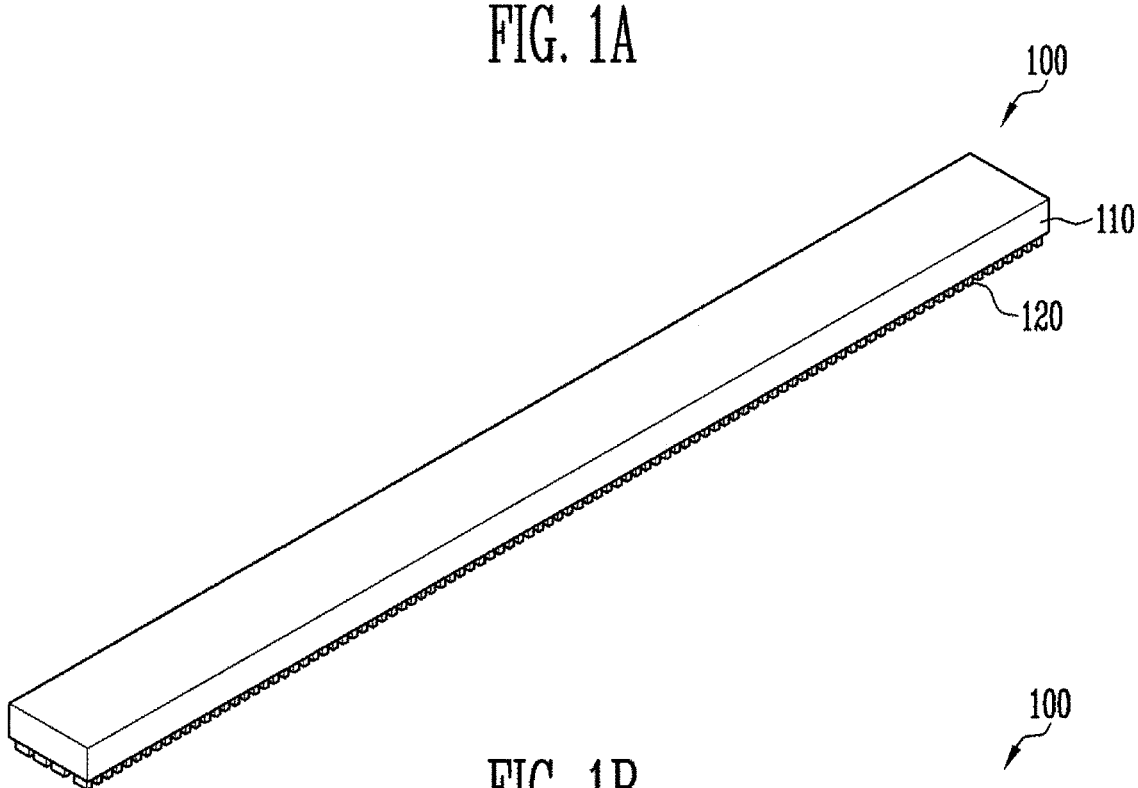
FIGS. 1A and 1B are perspective views of a semiconductor chip according to an embodiment of the present invention.

Example (or exemplary) embodiments of the present invention will be described more fully hereinafter with reference to the accompanying drawings; however, aspects of the present invention may be embodied in different forms and should not be construed as limited to the embodiments set forth herein. Rather, these embodiments are provided so that this disclosure will be thorough and complete and will full convey the scope of the present invention to those skilled in the art.

In the accompanying drawings, elements not necessary for a complete understanding of the present invention by those skilled in the art may be omitted for clarity.

It will be understood that when an element or layer is referred to as being "on," "connected to," or "coupled to" another element or layer, it may be directly on, connected, or coupled to the other element or layer or one or more intervening elements or layers may also be present. When an element or layer is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements. The same reference numerals designate the same elements. As used herein, the term "and/or" includes any and all combinations of one or more of the associated listed items. Further, the use of "may" when describing embodiments of the present invention relates to "one or more embodiments of the present invention." Expressions, such as "at least one of," when preceding a list of elements, modify the entire list of elements and do not modify the individual elements of the list. Also, the term "exemplary" is intended to refer to an example or illustration. As used herein, the terms "use," "using," and "used" may be considered synonymous with the terms "utilize," "utilizing," and "utilized," respectively.

It will be understood that, although the terms first, second, third, etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of example embodiments. In the figures, dimensions of the various elements, layers, etc. may be exaggerated for clarity of illustration.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

The terminology used herein is for the purpose of describing particular example embodiments of the present invention and is not intended to be limiting of the described example embodiments of the present invention. As used herein, the singular forms "a" and "an" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components but do not preclude the presence or addition of one or more other features, integers, steps, operations, elements, components, and/or groups thereof.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C, § 132(a).

Figure 1B:
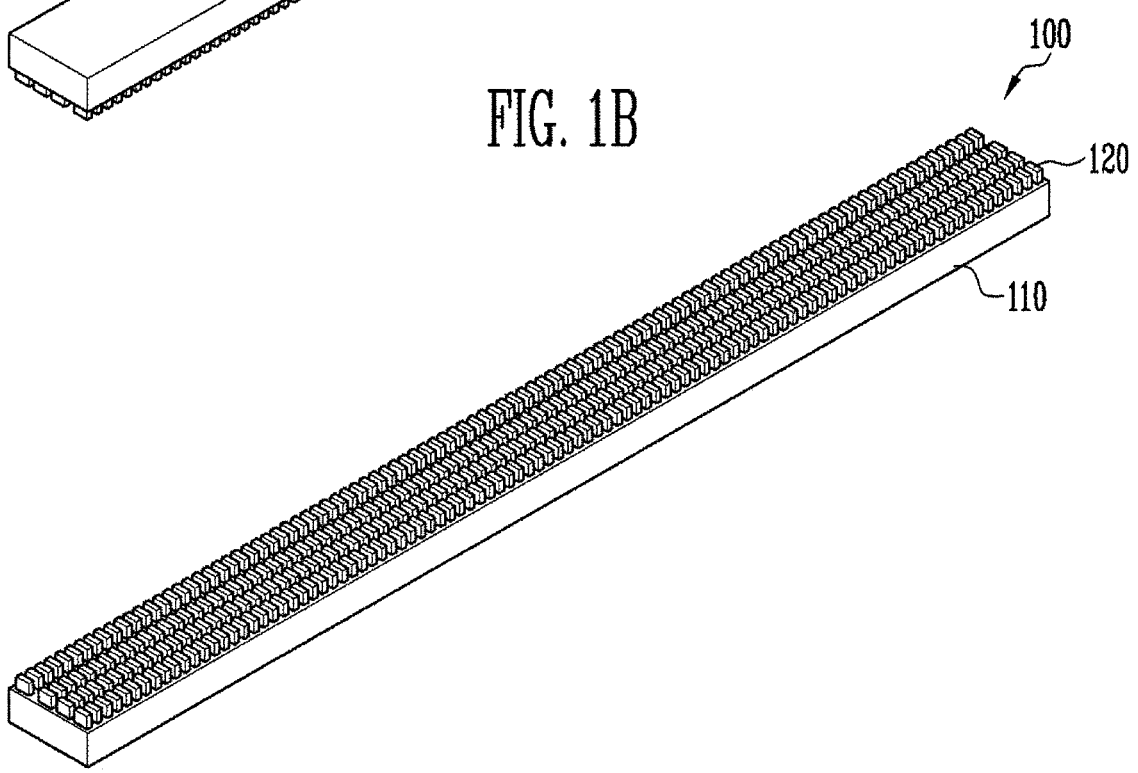
Figure 2:
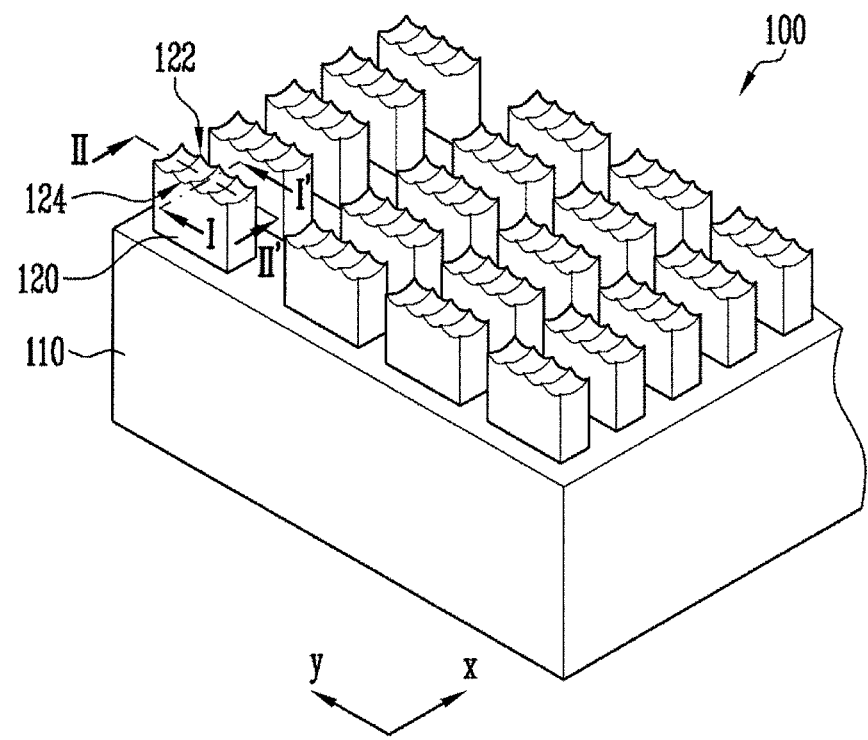
FIG. 2 is a perspective view illustrating an area of the semiconductor chip shown in FIGS. 1A and 1B.

FIGS. 1A and 1B are perspective views of a semiconductor chip according to an embodiment of the present invention. FIG. 2 is a perspective view illustrating an area of the semiconductor chip shown in FIGS. 1A and 1B. For ease of illustration, in FIGS. 1A, 1B, and 2, a base substrate and bumps provided on one surface of the base substrate from among elements of the semiconductor chip are schematically illustrated.

Referring to FIGS. 1A and 1B, the semiconductor chip 100 according to an embodiment of the present invention includes a base substrate 110 and at least one bump 120 provided on one surface of the base substrate 110. The semiconductor chip 100 may include a plurality of bumps 120 arranged on the same surface (e.g., the one surface or a lower surface) of the base substrate 110 in a regular or repeating pattern (e.g., the plurality of bumps 120 may be arranged to have a predetermined pitch).

The base substrate 110 may be a silicon wafer. However, the present invention is not limited thereto, a material and/or a shape of the base substrate 110 may vary. A circuit layer, on which various circuit elements and/or wiring lines are arranged, may be provided in (or on) the base substrate 110.

The at least one bump 120 for electrically connecting the circuit elements and/or the wiring lines to an electronic device (e.g., a display panel) may be provided on at least one surface of the base substrate 110. According to some embodiments, the bump 120 may be a metal bump.

According to some embodiments, the plurality of bumps 120 includes input/output bumps for transmitting input/output signals and may be provided on one surface of the base substrate 110. For example, at least a row of input bumps and a row of output bumps may be provided on the one surface of the base substrate 110, and the input bumps and the output bumps may be spaced or separated from each other (e.g., the input bumps and the output bumps may be spaced or separated from each other by at least a uniform distance).

In the embodiment illustrated in FIGS. 1A and 1B, the bumps 120 are regularly arranged on the one surface of the semiconductor chip 100 in a horizontal direction and a vertical direction. However, the present invention is not limited thereto. For example, a size (e.g., a length, a width, and/or a height) of the bumps 120, the number of bumps 120, an arrangement structure or configuration of the bumps 120, and/or a pitch between the bumps 120 may vary. For example, the bumps 120 may be arranged in zigzags.

Referring to FIG. 2, according to some embodiments, surfaces of the bumps 120 include a plurality of protrusions 122 and concave portions 124. The concave portions 124 may be dimples formed on one surface of each of the bumps 120.

For example, according to some embodiments of the present invention, each of the bumps 120 includes the plurality of concave portions 124 arranged in a longitudinal direction (e.g., a y-direction) such that the plurality of protrusions 122 are also arranged in the longitudinal direction of the bumps 120. Each of the bumps 120 includes at least one concave portion 124 in a short direction (e.g., an x-direction) such that at least two protrusions 122 are arranged in the short direction.

When each of the bumps 120 includes the plurality of concave portions 124 in at least the longitudinal direction, the bumps 120 may be easily directly connected to the connection pads of an electronic device, such as a display panel, when the semiconductor chip 100 is electrically connected to the electronic device. For example, during an initial stage of a connection process (e.g., a bonding process) of the electronic device in which the surfaces of the bumps 120 connected to the connection pads are concavo-convex, such as when each of the bumps 120 includes the plurality of concave portions 124 in the longitudinal direction, pressure may be concentrated on the plurality of protrusions 122 at a connection interface (e.g., a bonding interface). Therefore, greater friction energy may be applied to the connection interface such that the bumps 120 may be easily directly connected to the connection pads of the electronic device even using relatively low-pressure process and the quality of the connection may be improved.

When the bumps 120 are directly connected to and electrically connected to the connection pads of the electronic device, an adhesive including conductive particles, such as an anisotropic conductive film (ACF), may be omitted. Therefore, although each of the bumps 120 has a fine size, for example, a fine width (e.g., a length in the short direction), a fine length (e.g., a length in the longitudinal direction), and/or a fine height and/or the pitch between the bumps 120 is fine, for example, about 10 µm to about 15 µm (e.g., no larger than about 15 µm), the bumps 120 may be stably connected to the connection pads of the electronic device. In addition, the bumps 120 and the connection pads may be electrically connected to each other with a relatively low resistance therebetween due to the direct connection structure.

According to some embodiments, each of the bumps 120 may have a width of about 5 µm to about 20 µm. When each of the bumps 120 has a width smaller than 5 µm, it may be difficult to perform the connection process. Therefore, the connection process may be stably performed when the width of each of the bumps 120 is greater than 5 µm. When each of the bumps 120 has a width larger than 20 µm, a degree of integration may be reduced and a fine pitch condition may not be satisfied.

According to some embodiments of the present invention, the plurality of protrusions 122 and concave portions 124 are formed on each of the bumps 120 so that, at the initial stage of the connection process, pressure is concentrated on the protrusions 122 and the friction energy may be increased or amplified. In addition, when the protrusions 122 are combined with (or brought into contact with) the surfaces of the connection pads and melt to begin forming a diffusion layer, a conductive connection layer may be formed between the bumps 120 and the connection pads corresponding thereto in the form of surface connection. When the plurality of protrusions 122 and concave portions 124 are on the surface of each of the bumps 120, friction interfaces between the bumps 120 and the connection pads increase such that a high quality connection layer may be formed although relatively low pressure is applied thereto. Therefore, a stable connection structure may be provided between the bumps 120 and the connection pads.

Figure 3A:
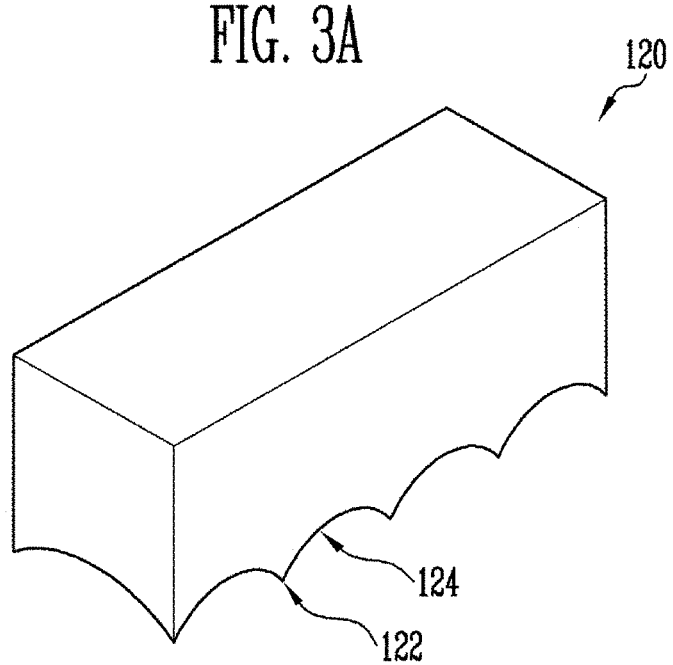
FIGS. 3A-3G are perspective views of a bump according to embodiments of the present invention.
Figure 3B:
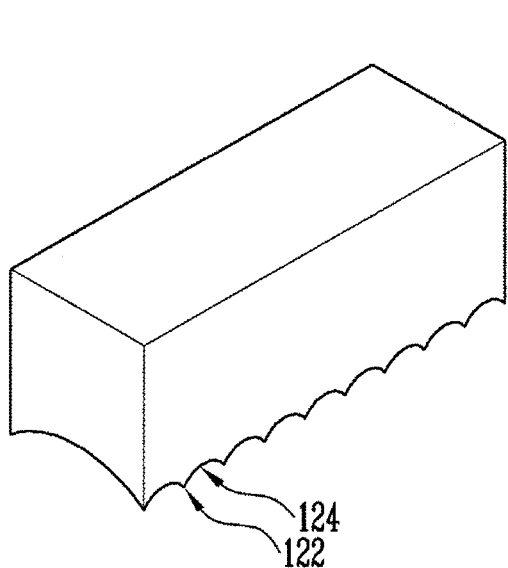
Figure 3D:
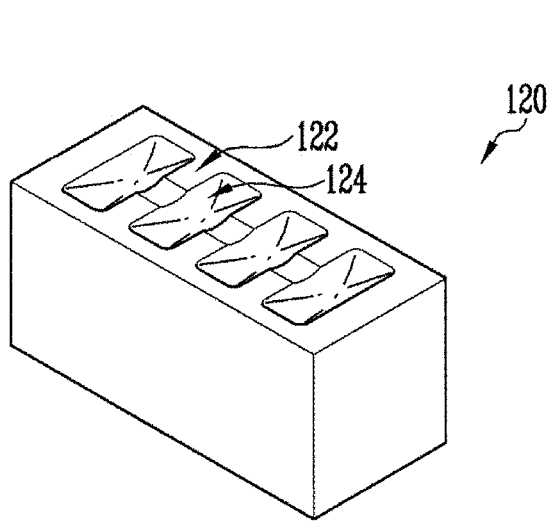
Figure 3C:
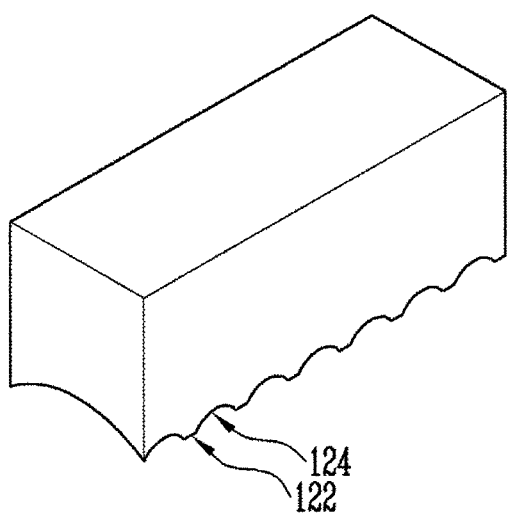
Figure 3E:
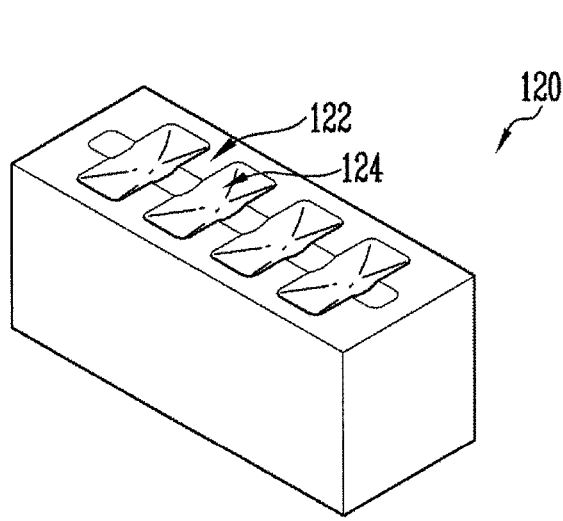
Figure 3F:
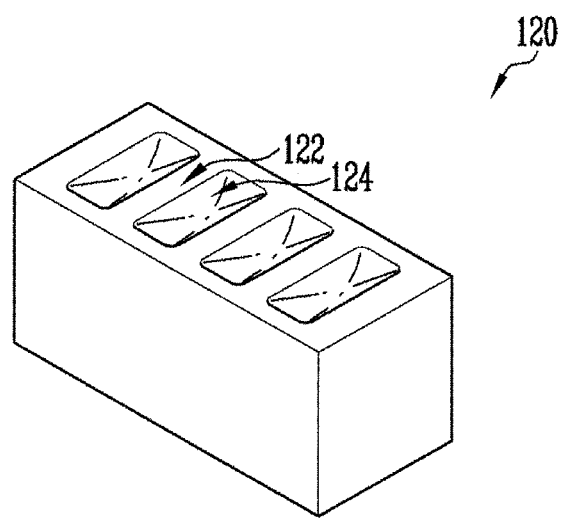
Figure 3G:
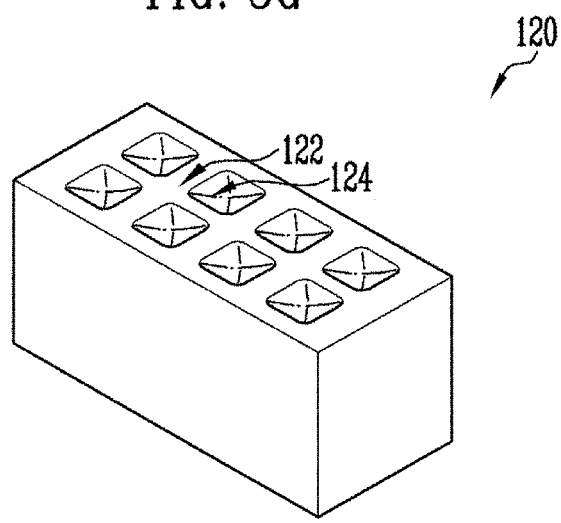

FIGS. 3A-3G are perspective views of a bump according to embodiments of the present invention. FIGS. 3A-3C illustrate an embodiment in which the concave portions 124 formed on one surface the bump 120 extend to an external wall (e.g., a side wall) of the bump 120. A surface of the bump 120 on which the concave portions 124 are provided is illustrated as facing downwardly considering a direction in which the bumps 120 face the connection pads when the semiconductor chip 100 is mounted on (or to) the electronic device.

FIGS. 3D-3G illustrate an embodiment in which the concave portions 124 formed on one surface of each of the bumps 120 are surrounded by the protrusions 122. In order to show a shape of each of the concave portions 124, the surface of the bump 120 on which the concave portions 124 are formed is illustrated as facing upwardly.

Referring to FIGS. 3A-3G, each of the bumps 120 includes the plurality of concave portions 124. According to embodiments, a size (e.g., an area and/or a depth) and a shape of each of the concave portions 124 provided on the surface of each of the bumps 120, the number of the concave portions 124, and/or an arrangement structure or configuration of the concave portions 124 may vary. For example, each of the bumps 120 may have a concavo-convex surface, such as those illustrated in FIGS. 3A-3G or may have a modified concavo-convex surface.

On the surface of each of the bumps 120, the plurality of concave portions 124 may be connected to each other (e.g., may extend to contact each other or may be directly adjacent each other) or may be separated or spaced from each other. In addition, a shape of each of the protrusions 122 provided on the surface of each of the bumps 120 may vary. For example, the protrusions 122 may have sharp tips or a gentle slope.

The plurality of concave portions 124 are provided in (e.g., are arranged in) at least the longitudinal direction (e.g., the length direction) of each of the bumps 120. Therefore, the plurality of protrusions 122 are formed in (e.g., are arranged in) the longitudinal direction of each of the bumps 120. During an initial stage of the connection process between the semiconductor chip 100 including the bumps 120 and the connection pads of the electronic device, a load applied to the semiconductor chip 100 is not evenly distributed across the entire surfaces of the bumps 120 (e.g., the load is not concentrated on the entire surfaces of the bumps 120) but is concentrated on the protrusions 122. Because pressure P is proportional to an applied load F and is inversely proportional to a cross-sectional area A, although the same or substantially the same load F is applied to the semiconductor chip 100 (e.g., the same or substantially the same load F as in a conventional connection process with a conventional semiconductor chip), during the initial stage of the connection process, friction primarily occurs at (e.g., only occurs at) the protrusions 122 so that the pressure P applied to the protrusions 122 is amplified. For example, according to embodiments of the present invention, the pressure P applied to the protrusions 122 is amplified by forming the plurality of concave portions 124 on the surface of each of the bumps 120, thereby reducing a contact area between the bumps 120 and the connection pads 212 at the initial stage of the connection process. Therefore, greater friction energy may be applied to the friction interfaces.

Because greater friction energy is applied to the connection interfaces formed by the protrusions 122, the connection process may be easily performed, and the semiconductor chip 100 may be easily connected to the electronic device even without using a high-pressure process.

In addition, because each of the bumps 120 includes the plurality of concave portions 124 in at least the longitudinal direction (e.g., the length direction), a surface area of each of the bumps 120 may be effectively increased. Therefore, when the protrusions 122 are melted by the friction energy such that a connection layer is formed between the bumps 120 and the connection pads of the electronic device, a connection therebetween may be sufficiently secured. Therefore, the connection layer may be easily formed and a quality of the solid state connection may be improved.

A size of each of the concave portions 124 formed in the bumps 120, the number of the concave portions 124, and/or a pitch between the concave portions 124 may vary in accordance with a range of load and pressure that may be applied during the connection process. For example, the range of the load that may be applied during the connection process and the connection pressure necessary in the connection process may be determined or calculated, and the size of each of the concave portions 124 formed in each of the bumps 120, the number of the concave portions 124, and/or the pitch between the concave portions 124 may be determined considering a size, resolution, and/or a material of the electronic device.

In addition, according to some embodiments, the plurality of concave portions 124 may be provided in (e.g., arranged in) the short direction (e.g., the width direction) of each of the bumps 120. In such an embodiment, at least three protrusions 122 may be formed in the short direction so that the connection layer may be easily formed between the semiconductor chip 100 and the connection pads of the electronic device.

Figure 4A:
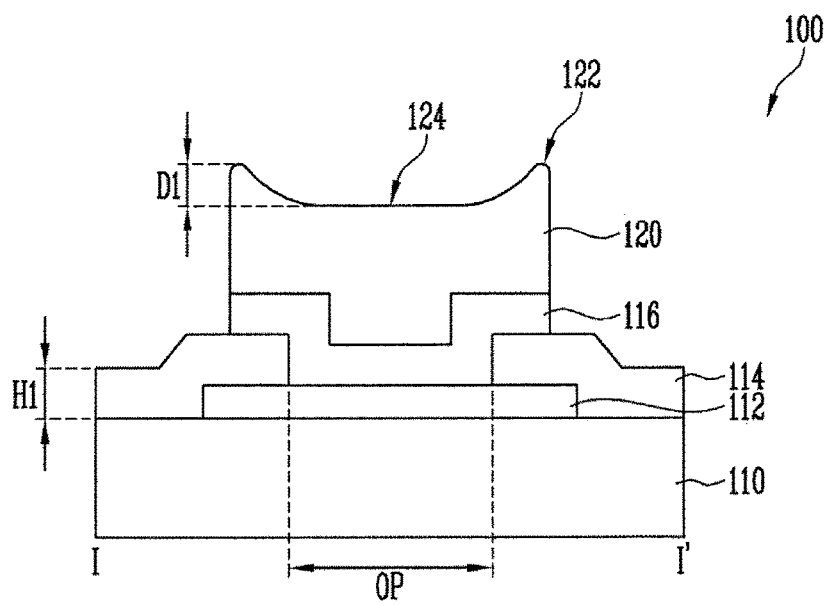
FIGS. 4A and 4B are cross-sectional views taken along the lines I-I' and II-II' of the semiconductor chip shown in FIG. 2 according to an embodiment.
Figure 4B:
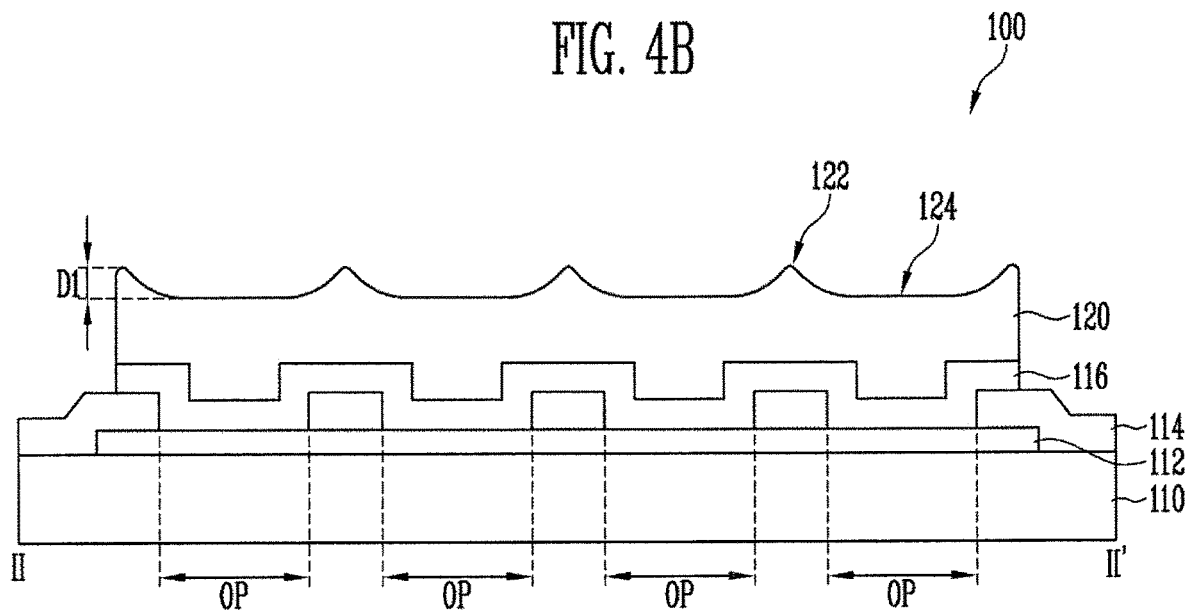

FIGS. 4A and 4B are cross-sectional views taken along the lines I-I' and II-II' of the semiconductor chip shown in FIG. 2 according to an embodiment. Specifically, FIG. 4A is a cross-sectional view taken along the line I-I' of the semiconductor chip shown in FIG. 2 in the short direction (e.g., the width direction or an x direction) of a bump, and FIG. 4B is a cross-sectional view taken along the line II-II' of the semiconductor chip shown in FIG. 2 in the longitudinal direction (e.g., the length direction or a y direction) of the bump.

Referring to FIG. 4A, the semiconductor chip 100 includes the base substrate 110, at least one conductive pad 112 provided on one surface of the base substrate 110, an insulating layer 114 provided in at least one area on the conductive pad 112, a conductive medium layer 116, and a bump 120. According to the illustrated embodiment, the conductive medium layer 116 and the bump 120 may be arranged on one surface (e.g., an upper surface) of the conductive pad 112 to overlap the corresponding conductive pad 112. The conductive medium layer 116 and the bump 120 may be electrically connected to the conductive pad 112 through an area of the conductive pad 112 that is not covered by (e.g., is exposed by) the insulating layer 114.

The conductive pad 112 may include at least one conductive layer, for example, a metal layer; however, the material of the conductive pad 112 is not limited to metal, and the material of the conductive pad 112 may vary. For example, the conductive pad 121 may include a metal, an alloy of different metals, a conductive polymer, and/or a conductive metal oxide.

For example, the conductive pad 112 may include copper (Cu), silver (Ag), gold (Au), platinum (Pt), palladium (Pd), nickel (Ni), tin (Sn), aluminum (Al), cobalt (Co), rhodium (Rh), iridium (Ir), iron (Fe), ruthenium (Ru), osmium (Os), manganese (Mn), molybdenum (Mo), tungsten (W), niobium (Nb), tantalum (Ta), titanium (Ti), bismuth (Bi), antimony (Sb), and/or lead (Pb). The conductive polymer that may form the conductive pad 112 may include one of a polythiophene-based compound, a polypyrrole-based compound, a polyaniline-based compound, a polyacetylene-based compound, a polyphenylene-based compound, and/or a mixture of the above compounds. For example, a PEDOT/PSS compound may be used as the polythiophene-based compound. A conductive metal oxide that may form the conductive pad 112 may include an indium tin oxide (ITO), an indium zinc oxide (IZO), an antimony zinc oxide (AZO), an indium tin zinc oxide (ITZO), a zinc oxide (ZnO), and/or a tin oxide ($SnO_2$). In addition to the above-described conductive materials, any suitable electrically conductive material may be used to form the conductive pad 112.

According to some embodiments, an area in which the conductive pad 112 is formed may be larger than an area in which the conductive medium layer 116 and the bump 120 are formed; however, the present invention is not limited thereto. The conductive pad 112 is covered with the insulating layer 114, the conductive medium layer 116, and/or the bump 120 and may not be exposed to the outside.

According to some embodiments, the insulating layer 114 may be provided on the conductive pad 112. The insulating layer 114 may have an opening OP that exposes at least an area or portion (e.g., a bonding area or a contact area) of the conductive pad 112. For example, the insulating layer 114 may be patterned to expose a center portion of the conductive pad 112 and to cover an edge (e.g., an edge area) of the conductive pad 112. For example, the insulating layer 114 is provided on a surface of the base substrate 110, on which the conductive pad 112 is provided, and the opening OP in the insulating layer 114 may be positioned to expose an area (e.g., a center area) of the conductive pad 112. The insulating layer 114 may be a passivation layer that protects the semiconductor chip 100.

According to some embodiments, the insulating layer 114 may include at least one oxide film and/or at least one nitride film; however, the present invention is not limited thereto. For example, the insulating layer 114 may be formed of a silicon nitride film ($SiN_x$) and/or a silicon oxide film ($SiO_2$).

The conductive medium layer 116 may be provided on the conductive pad 112 (e.g., may be provided on the portion of the conductive pad 112) exposed by the insulating layer 114. The conductive medium layer 116 may be formed of at least one metal layer. For example, the conductive medium layer 116 may be formed of at least one metal layer including Cu, Ag, Au, Pt, Pd, Ni, Sn, Al, Co, Rh, Ir, Fe, Ru, Os, Mn, Mo, W, Nb, Ta, Ti, Bi, Sb, Pb, and/or an alloy of some of these metals. For example, the conductive medium layer 116 may be a seed layer of the semiconductor chip 100 and electrically connects the conductive pad 112 and the bump 120.

The bump 120 may be provided on the conductive medium layer 116. According to some embodiments, the bump 120 is arranged on the area or portion of the conductive pad 112 exposed by (or through) the opening OP of the insulating layer 114 and on the insulating layer 114 around the opening OP together with the conductive medium layer 116.

The bump 120 has a concavo-convex surface corresponding to a profile of the insulating layer 114. For example, a concave portion 124 is formed on a surface of the bump 120 corresponding to the opening OP of the insulating layer 114 and protrusions 122 are formed around the concave portion 124. According to some embodiments, a depth D1 of the concave portion 124 may be similar to or equal to a height (e.g., a thickness) H1 of the insulating layer 114. For example, the depth D1 of the concave portion 124 may correspond to the height H1 of the insulating layer 114. For example, when the height H1 of the insulating layer 114 is 1 μm to 2 μm, the depth D1 of the concave portion 124 may be 1 μm to 2 μm. When the height H1 of the insulating layer 114 is less than 1 μm, the insulating layer 114 may not sufficiently insulate and may not function as a passivation layer. When the height H1 of the insulating layer 114 is greater than 2 μm, for example, 4 μm, probability that a short is generated in the conductive medium layer 116 may increase. Therefore, the height H1 of the insulating layer 114 may be in a range in which the insulating property is stably secured and the conductive medium layer 116 is not shorted. For example, the height H1 of the insulating layer 114 may be 1 μm to 4 μm. Because the surface of the bump 120 follows or substantially follows the profile of the insulating layer 114, the depth D1 of the concave portion 124 may correspond to the height H1 of the insulating layer 114, for example, the depth D1 of the concave portion 124 may be 1 μm to 4 μm.

The bump 120 may be formed of at least one metal layer. For example, the bump 120 may be formed of at least one metal layer including Cu, Ag, Au, Pt, Pd, Ni, Sn, Al, Co, Rh, Ir, Fe, Ru, Os, Mn, Mo, W, Nb, Ta, Ti, Bi, Sb, Pb, and/or an alloy of some of these metals. The bump 120 is connected to a connection pad of an electronic device and electrically connects the semiconductor chip 100 and the electronic device to each other.

Referring to FIG. 4B, the bump 120 includes a plurality of the concave portions 124 in the longitudinal direction. The insulating layer 114 may include the plurality of openings OP arranged in the longitudinal direction of each bump area. Ones of the plurality of openings OP may be integrated with each other (e.g., may contact each other or form a continuous opening) or may be separated or spaced from each other in the respective bump areas.

FIGS. 5A-5F are plan views of an insulating layer according to embodiments of the present invention. FIGS. 5A-5F illustrate various embodiments of openings provided in the insulating layer; however, the present invention is not limited thereto. For example, the insulating layer may have openings according to one of the embodiments illustrated in FIGS. 5A-5F or may have modified openings. In FIGS. 5A-5F, in order to clarify positions of the openings, bump areas, in each of which a bump is to be formed, are additionally illustrated and the bump areas are indicated with dotted lines.

Referring to FIGS. 5A-5F, the insulating layer 114 is formed to cover one surface of the base substrate 110 on which the conductive pad 112 is provided and has openings OP1 and/or OP2 that expose areas of the conductive pads 112 in bump areas 120a at where the bumps 120 are to be respectively formed.

Figure 5A:
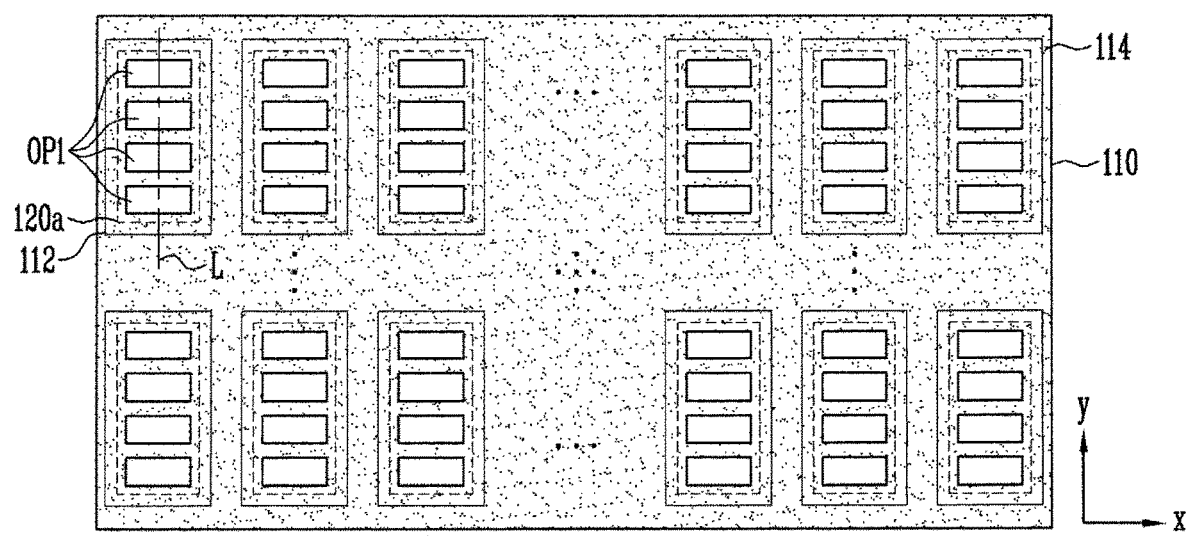
FIGS. 5A-5F are plan views of an insulating layer according to embodiments of the present invention.

According to the embodiment illustrated in FIG. 5A, the insulating layer 114 may have a plurality of separated first openings OP1 arranged in each of the bump areas 120a. For example, the plurality of first openings OP1 in the insulating layer 114 may be arranged on one line L extending in a longitudinal direction (e.g., a y direction) of the bump areas 120a (e.g., of the bump 120 to be formed in the bump area 120a). According to this embodiment, the first openings OP1 may be arranged on the one line L in the longitudinal direction of the bump 120 at uniform intervals. Each of the first openings OP1 may extend in a direction that crosses (or intersects) the longitudinal direction of the bump 120, for example, in the short direction (e.g., the x direction) of the bump 120.

Figure 5B:
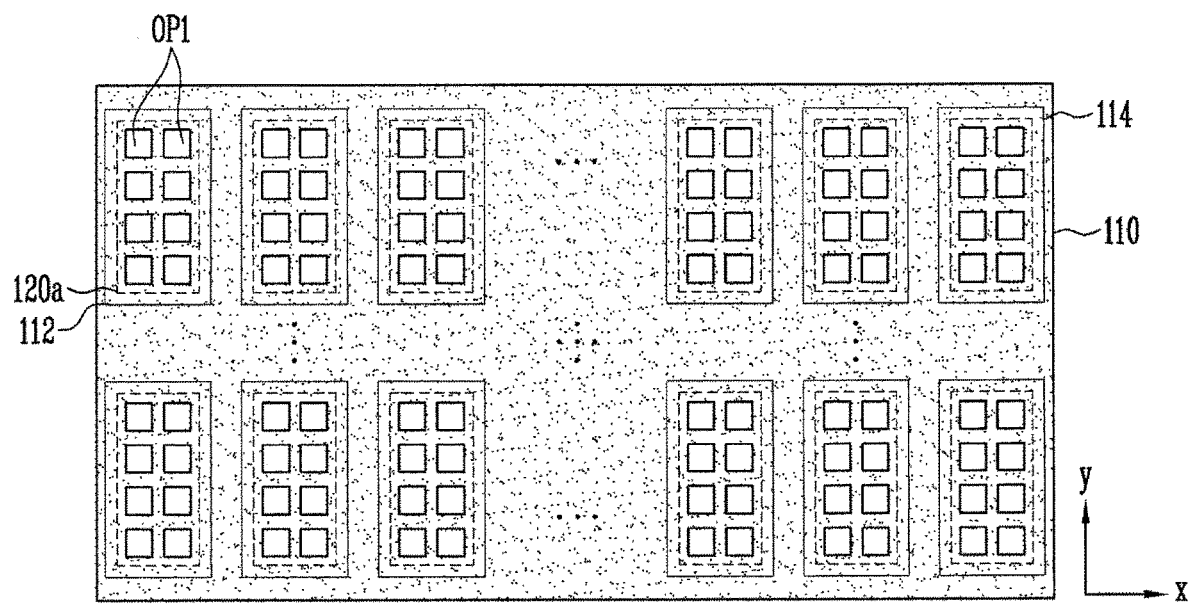

According to the embodiment illustrated in FIG. 5B, a plurality of first openings OP1 (e.g., at least two first openings OP1) may be arranged in each of the bump areas 120a adjacent each other in the short direction. For example, a size and a shape of each of the first openings OP1, the number of the first openings OP1, a pitch between the first openings OP1, and/or an arrangement structure or configuration of the first openings OP1 may vary.

Figure 5C:
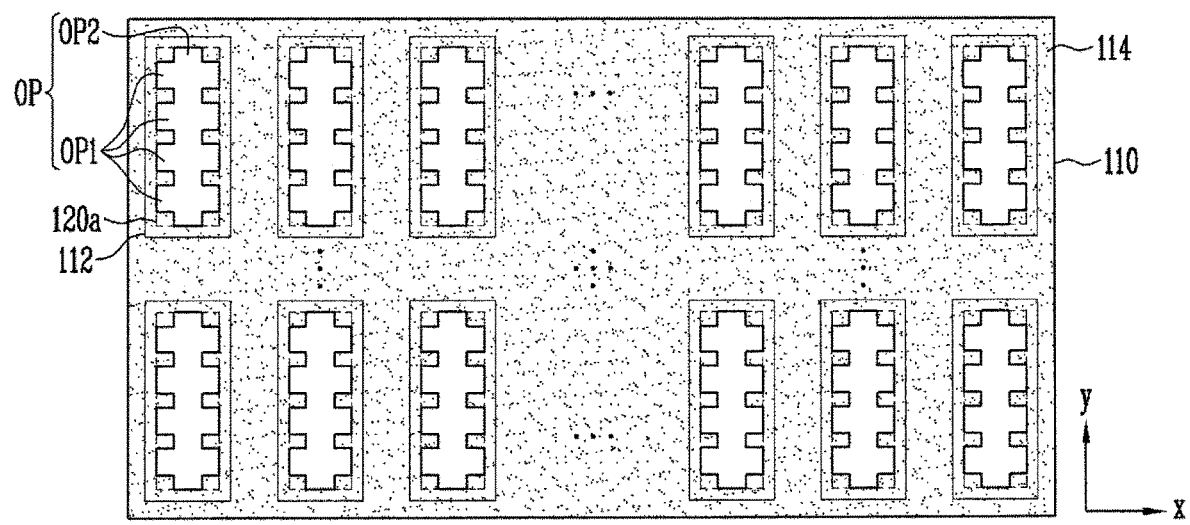
Figure 5D:
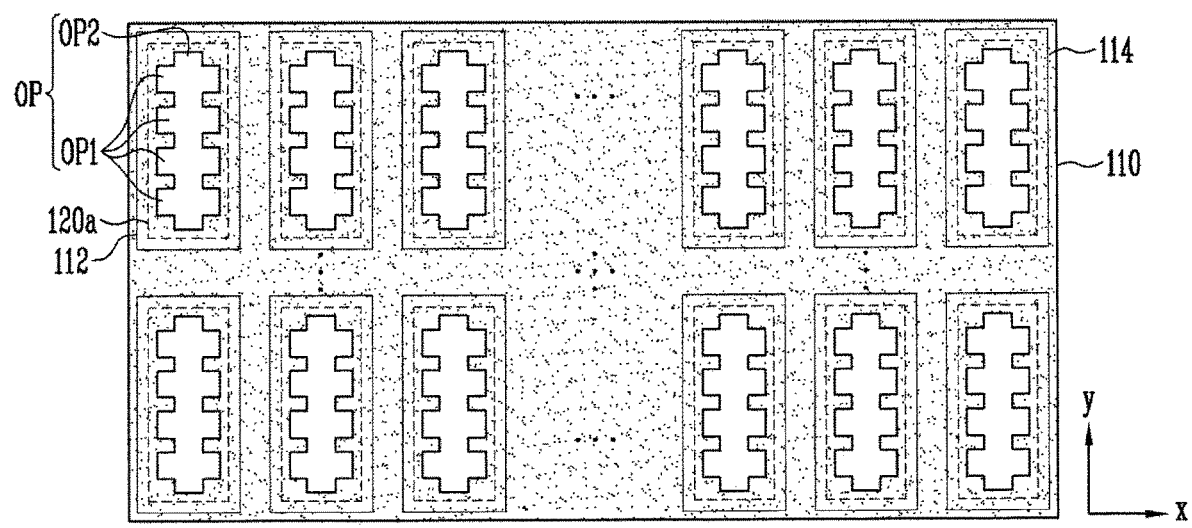

According to the embodiment illustrated in FIG. 5C, the insulating layer 114 may further have at least one second opening OP2 in each of the bump areas 120a that extends in the longitudinal direction of the respective bump area 120 and integrates (or connects) the first openings OP1 with each other. For example, according to this embodiment, in each of the bump areas 120a, the openings OP1 and OP2 arranged in the each bump area 120a may be integrated with each other (e.g., may contact or may be open to each other).

According to the embodiment illustrated in FIG. 5C, a length of the first openings OP1 and/or a length the second openings OP2 may be equal to or substantially equal to a width and/or a length of the respective bump area 120a (e.g., of the respective bump 120 to be formed in the bump area 120a). For example, the first openings OP1 are horizontally arranged in each of the bump areas 120a so as to have a length equal to or substantially equal to the width of the bump 120, and the second openings OP2 may be vertically arranged in each of the bump areas 120a so as to have a length equal to or substantially equal to the length of the bump 120.

A size (e.g., a width and/or a length) of the first openings OP1 and/or the second openings OP2, the number of the first openings OP1 and/or the second openings OP2, and/or a shape of the first openings OP1 and/or the second openings OP2 may vary. For example, according to the embodiment illustrated in FIG. 5D, the first openings OP1 are arranged in each of the bump areas 120a so as to have a smaller length than the width of the respective bump area 120a, and the second openings OP2 may be arranged in each of the bump areas 120a so as to have a smaller length than the length of the bump area 120a.

Figure 5E:
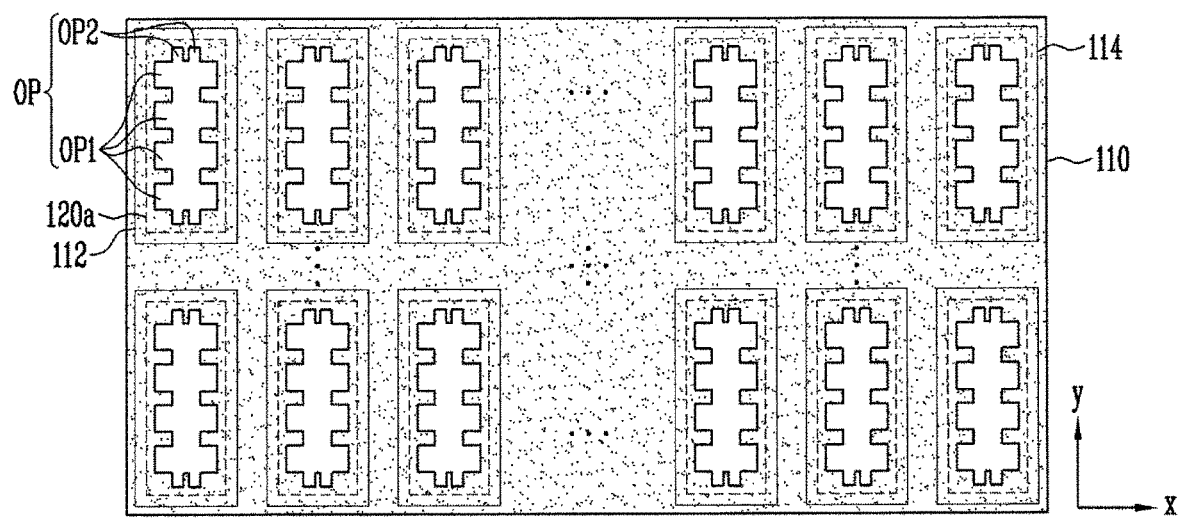
Figure 5F:
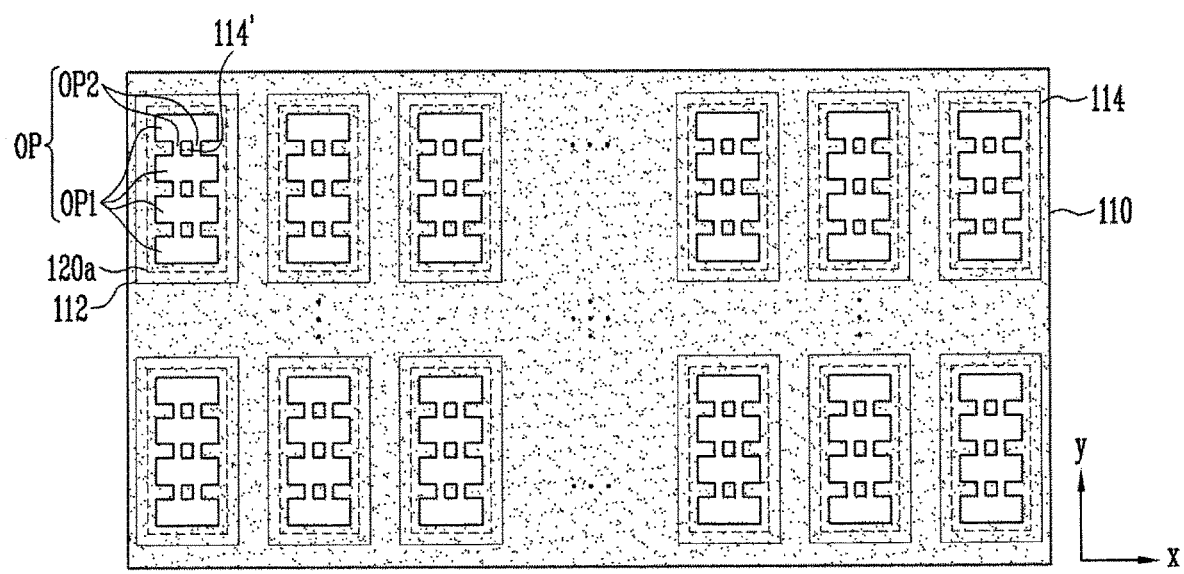

According to the embodiment illustrated in FIGS. 5E and 5F, a plurality of second openings OP2 may be arranged in each of the bump areas 120a. In addition, a shape of the opening OP including the first and second openings OP1 and OP2 may vary.

According to the embodiment illustrated in FIG. 5F, the insulating layer 114 may include island-shaped insulating bodies 114' surrounded by the opening OP (e.g., surround along a periphery thereof by the opening(s) OP). The insulating bodies 114' may be arranged in the bump area 120a, and a size and a shape of the insulating body 114' and the number of insulating bodies 114' may vary.

As described above, the size and the shape of each of the openings OP provided in the insulating layer 114, the number of the openings OP, and/or the arrangement structure or configuration of the openings OP may vary. For example, the opening OP may be formed by partially etching the insulating layer 114 in each of the bump areas 120a according to a desired area and shape of each of the concave portions 124 to be formed on the surface of the bump 120, the number of the concave portions 124, and/or an arrangement structure or configuration of the concave portions 124. For example, according to some embodiments of the present invention, the plurality of concave portions 124 may be formed in the longitudinal direction of each of the bumps 120 by arranging the plurality of openings OP in the insulating layer 114 in the longitudinal direction of each of the bump areas 120a.

Figure 6:
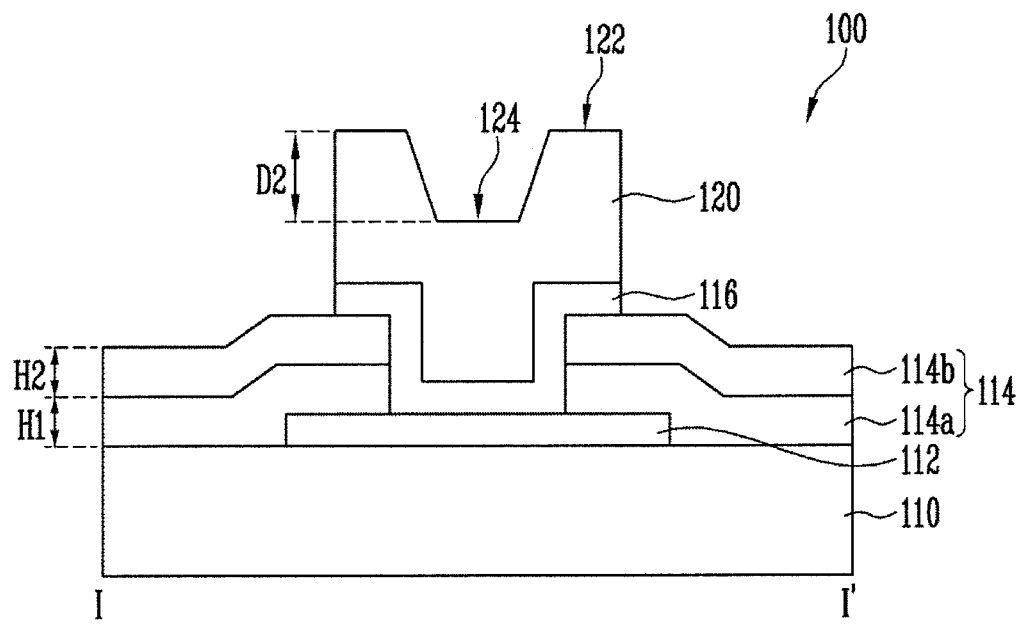
FIG. 6 is a cross-sectional view taken along the line I-I' of the semiconductor chip shown in FIG. 2 according to another embodiment.

FIG. 6 is a cross-sectional view taken along the line I-I' of the semiconductor chip 100 shown in FIG. 2 according to another embodiment. In FIG. 6, the same elements as those of FIG. 4A are denoted by the same reference numerals and detailed description thereof may be omitted.

Referring to FIG. 6, the insulating layer 114 may have a multilayer structure. For example, the multilayer structure of the insulating layer 114 may include at least one inorganic layer 114a and at least one organic layer 114b.

When the insulating layer 114 has the multilayer structure, the insulating layer 114 may have a height H1+H2 corresponding to the sum of a height H1 of the inorganic layer 114a and a height H2 of the organic layer 114b. When the height H1+H2 of the insulating layer 114 increases, a depth D2 of the concave portion 124 increases and a height and/or a volume of the protrusion 122 increases. For example, when the insulating layer 114 has the multilayer structure, the height H1+H2 of the insulating layer 114 may be about 3 μm to about 4 μm. In such an embodiment, the depth D2 of the concave portion 124 on the surface of the bump 120 may be about 3 μm to about 4 μm.

According to the embodiment illustrated in FIG. 4A, when the insulating layer 114 is formed of a single layer, the depth D1 of the concave portion 124 may be about 1 μm to about 2 μm. According to the embodiment illustrated in FIG. 6, when the insulating layer 114 has the multilayer structure including the inorganic layer 114a and the organic layer 114b, the depth D2 of the concave portion 124 may be about 3 μm to about 4 μm. For example, according to some embodiments, the depth D1 or D2 of the concave portion 124 may be about 1 μm to about 4 μm.

The height H1 or H1+H2 of the insulating layer 114 and the depth D1 or D2 of the concave portion 124 according to the height H1 or H1+H2 of the insulating layer 114 may vary. The height H1 or H1+H2 of the insulating layer 114 and the depth D1 or D2 of the concave portion 124 may be in a range in which the insulating property of the insulating layer 114 is sufficiently secured and the conductive medium layer 116 is not shorted. For example, the height H1 or H1+H2 of the insulating layer 114 and the depth D1 or D2 of the concave portion 124 may be about 1 μm to about 4 μm.

According to the embodiment illustrated in FIG. 6, as the depth D2 of the concave portion 124 increases and when the surface of the bump 120 in which the concave portions 124 are formed is connected to the connection pads of the electronic device, shear strength increases along with pressure concentration on the protrusions 122. As the volume of the protrusion 122 increases, a connection amount increases (e.g., a surface area connection or contact therebetween increases). Therefore, according to embodiments of the present invention, it is possible to easily perform a connection process and to improve the quality of connection.

Figure 7:
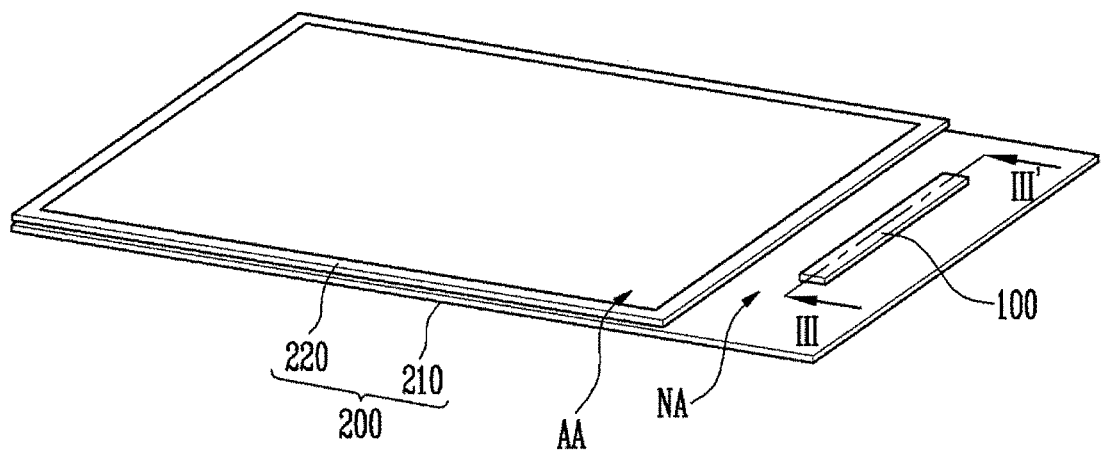
FIG. 7 is a perspective view of an electronic device according to an embodiment of the present invention.
Figure 8:
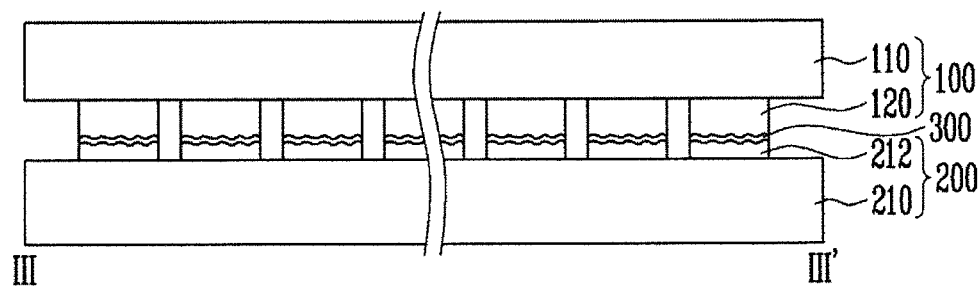
FIG. 8 is a cross-sectional view taken along the line of FIG. 7.

FIG. 7 is a perspective view of an electronic device according to an embodiment of the present invention. FIG. 8 is a cross-sectional view taken along the line of FIG. 7. In FIGS. 7 and 8, a display device is illustrated as an example of the electronic device; however, the electronic device, according to embodiments of the present invention, is not limited to the display device. In FIGS. 7 and 8, the same elements (e.g., a semiconductor chip 100) as those shown in FIGS. 1-6 are denoted by the same reference numerals and detailed description thereof may be omitted.

Referring to FIGS. 7 and 8, the electronic device, according to some embodiments, may be or may include a display panel 200, and the semiconductor chip 100 is mounted thereon.

The display panel 200 includes a first substrate 210 and a second substrate 220 that overlap each other at an active area AA, and a plurality of connection pads 212 may be provided in a non-active area NA of the first substrate 210. The active area AA in which pixels are arranged may be an area in which an image is to be displayed. The non-active area NA, excluding the active area AA, may include, for example, a wiring line area, a pad area, and/or various dummy areas. According to some embodiments, the display panel 200 may be an organic light-emitting display (OLED) panel, a liquid crystal (LC) display panel, or a plasma display panel; however, the display panel 200 is not limited thereto.

At least one of the first substrate 210 and the second substrate 220 may be a glass substrate or a plastic substrate. For example, the first substrate 210 and/or the second substrate 220 may be a flexible substrate including at least one material from among polyethersulfone (PES), polyacrylate, polyetherimide (PEI), polyethylene naphthalate (PEN), polyethylene terephthalate (PET), polyphenylene sulfide (PPS), polyarylate (PAR), polyimide (PI), polycarbonate (PC), cellulose triacetate (TAC), and cellulose acetate propionate (CAP). In addition, the first substrate 210 and/or the second substrate 220 may be a rigid substrate including glass and/or reinforced glass. The first substrate 210 and/or the second substrate 220 may be transparent. In addition, at least one of the first substrate 210 and the second substrate 220 may be formed of an insulating layer including an inorganic layer and/or an organic layer. For example, the second substrate 220 may be a thin film encapsulation (TFE) layer including an inorganic layer and/or an organic layer. However, the present invention is not limited to the above-discussed features.

The connection pads 212 may be formed of a conductive material and may be connected to various signal lines and/or power lines. The connection pads 212 may include a first metal, for example, aluminum (Al). The connection pads 212 may transmit power and/or various signals for driving the display panel 200 between the display panel 200 and the semiconductor chip 100.

The semiconductor chip 100 may be mounted on the first substrate 210 in the non-active area NA. The semiconductor chip 100 may include a driving circuit, for example, a scan driving circuit and/or a data driving circuit, for driving the display panel 200. In some embodiments, the driving circuit may be integrated in (or integral with) the semiconductor chip 100.

The semiconductor chip 100 may include the base substrate 110 and the plurality of bumps 120. According to some embodiments, the bumps 120 are arranged on one surface of the base substrate 110 so as to face the connection pads 212 and may be respectively electrically connected to the connection pads 212. According to some embodiments, the bumps 120 may include a second metal. The second metal may be the same as or different from the first metal. For example, the second metal may be gold (Au).

The semiconductor chip 100 shown in FIG. 7 may be the semiconductor chip 100 according to the embodiments illustrated in FIGS. 1-6. For example, as illustrated in FIGS. 1-6, the semiconductor chip 100 may include the plurality of conductive pads 112 arranged on one surface of the base substrate 110 that faces the connection pads 212 of the display panel 200 to respectively correspond to the bumps 120. Ones of the conductive pads 112 of the semiconductor chip 100 may be electrically connected to corresponding ones of the bumps 120. The insulating layer 114 covers the one surface of the base substrate 110 on which the conductive pads 112 are arranged, is between the bumps 120 and the conductive pads 112, and, in some embodiments, has the plurality of openings OP1 arranged on the one line L that extends in the longitudinal direction of the bump 120. According to some embodiments, each of the first openings OP1 may extend in a direction that crosses (or intersects) the longitudinal direction of the bump 120.

According to some embodiments, a conductive connection layer 300 is between the connection pads 212 and the bumps 120. The conductive connection layer 300 may be formed of a mixture of the first metal included in the connection pads 212 and the second metal included in the bumps 120 and may be a solid connection layer formed by causing friction between the bumps 120 and the connection pads 212 so that surfaces of the bumps 120 and the connection pads 212 melt when the semiconductor chip 100 is connected to the display panel 200 and then hardening the melted surfaces of the bumps 120 and the connection pads 212. For example, Al and Au may be mixed in (e.g., may be mixed to form) the conductive connection layer 300.

The connection pads 212 and/or the bumps 120 may have a fine width and/or a fine pitch of, for example, about 5 μm to about 20 μm. For example, according to some embodiments of the present invention, when the connection pads 212 and the bumps 120 are directly connected without using an ACF, a stable connection may be formed between the connection pads 212 and the bumps 120 even though the connection pads 212 and/or the bumps 120 may have a fine width and/or a fine pitch.

A non-conductive adhesive layer may be provided between the display panel 200 and the semiconductor chip 100. The non-conductive adhesive layer may be interposed between the display panel 200 and the semiconductor chip 100 so that the semiconductor chip 100 may stably adhere onto the display panel 200.

Figure 9:
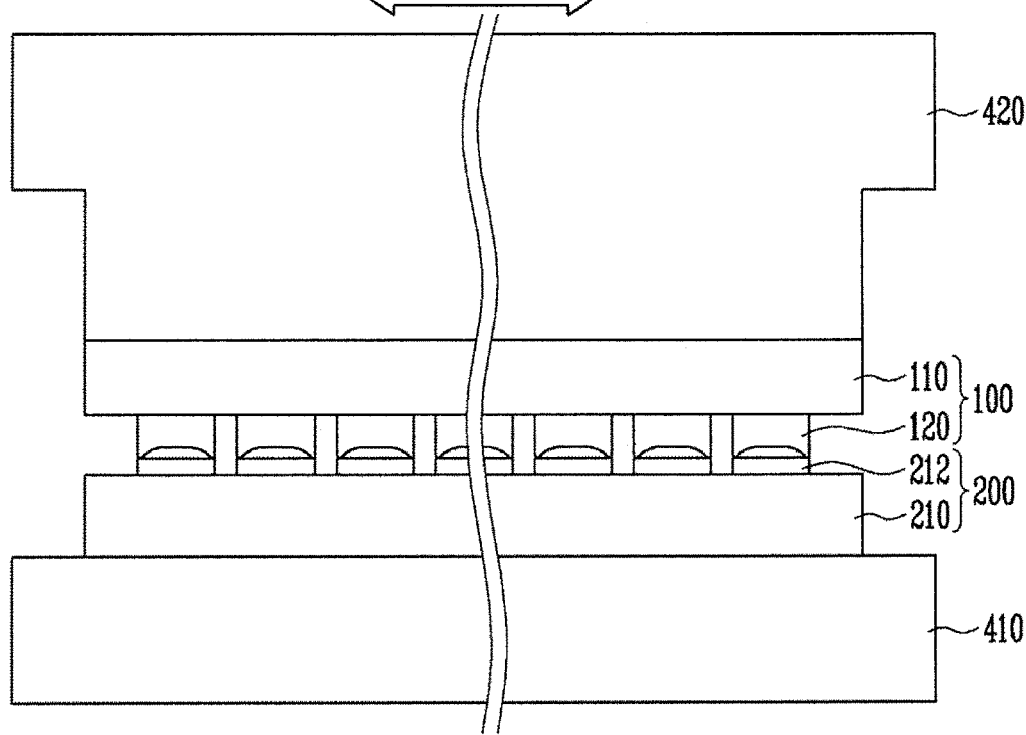
FIG. 9 is a cross-sectional view illustrating a method of connecting a semiconductor chip to an electronic device according to an embodiment of the present invention.
Figure 10:
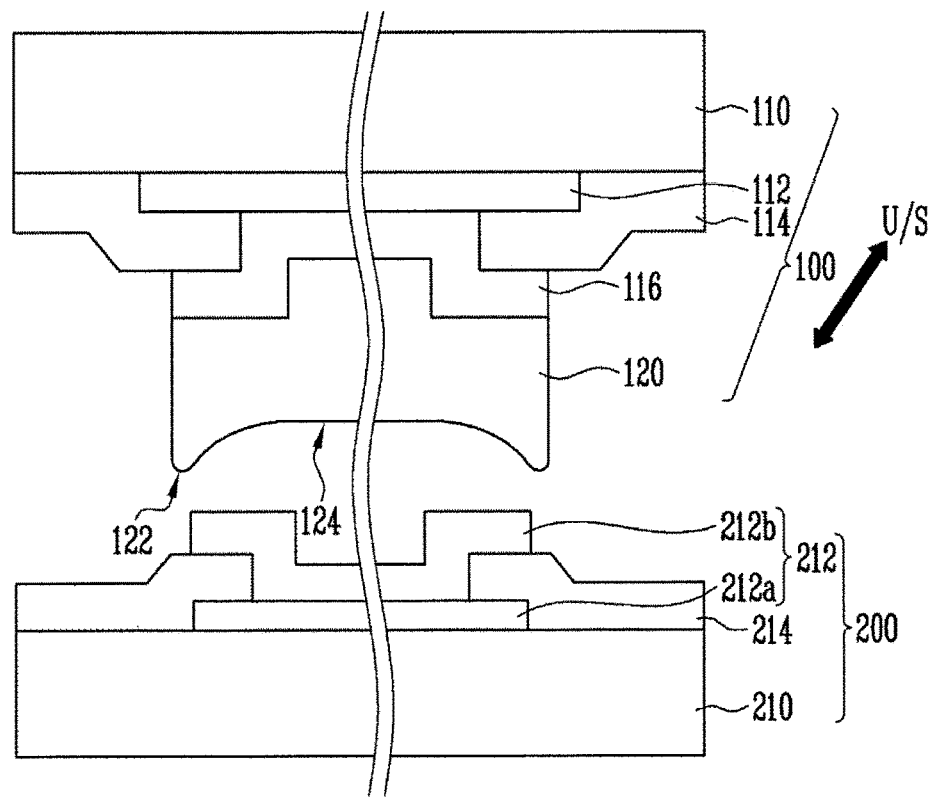
FIG. 10 is a cross-sectional view illustrating an area of the semiconductor chip and the electronic device shown in FIG. 9.

FIG. 9 is a cross-sectional view illustrating a method of connecting a semiconductor chip to an electronic device according to an embodiment of the present invention, and FIG. 10 is a cross-sectional view illustrating an area of the semiconductor chip and the electronic device shown in FIG. 9. The semiconductor chip and the display panel illustrated in FIGS. 9 and 10 may be the semiconductor chip 100 and the display panel 200 according to the embodiments illustrated in FIGS. 1-8. Therefore, in FIGS. 9 and 10, the same elements as those shown in FIGS. 1-8 are denoted by the same reference numerals and detailed descriptions thereof may be omitted.

Referring to FIGS. 9 and 10, the semiconductor chip 100 including the plurality of bumps 120 and the display panel 200 including the first substrate 210 including the plurality of connection pads 212 corresponding to the bumps 120 are formed and/or provided.

The semiconductor chip 100 may be the semiconductor chip according to the embodiment illustrated in FIGS. 1-8. For example, the semiconductor chip 100 may include the bumps 120 having the plurality of protrusions 122 and concave portions 124 in the surfaces thereof. According to some embodiments, the bumps 120 may include the plurality of protrusions 122 and concave portions 124 in the longitudinal direction.

The connection pads 212 may include first conductive layers 212a arranged on the first substrate 210 and second conductive layers 212b arranged on the first conductive layers 212a. One surface of the first substrate 210, on which the first conductive layers 212a are provided, may be covered with a protective layer 214 having an insulative property, and the protective layer 214 has openings that expose partial regions of (e.g., that partially expose) the first conductive layers 212a. The second conductive layers 212b may contact the first conductive layers 212a through the openings formed in the protective layer 214.

The first conductive layers 212a may include a metal, an alloy of different metals, a conductive polymer, and/or a conductive metal oxide. For example, the first conductive layers 212a may include the conductive material(s) that form the conductive pads 112 as illustrated in FIG. 4A.

The second conductive layers 212b may be formed of at least one metal layer. For example, the second conductive layers 212b may include a metal or an alloy of different metals that form the bumps 120 as illustrated in FIG. 4A. For example, the second conductive layers 212b may include the same metal material as the bumps 120; however, the present invention is not limited thereto. For example, the bumps 120 may be a single layer including Au, and the second conductive layer 212b may be formed of a Ti/Al/Ti stacked-layer structure.

A connection process involving different kinds of metals, which generally requires greater energy than a connection process involving the same kind of metals, may be easily performed by forming the plurality of protrusions 122 and concave portions 124 in the surfaces of the bumps 120. Therefore, the second conductive layers 212b may be formed of different kinds of metals from the bumps 120 or of the same kind of metals as the bumps 120.

Then, the semiconductor chip 100 is arranged on (or over) the first substrate 210 so that the bumps 120 and the connection pads 212 face each other. The display panel 200 may be set on a stage 410 of a connection apparatus, and the semiconductor chip 100 may be vacuously adhered onto a head part 420 of the connection apparatus and may be aligned with the first substrate 210.

Then, vibration and pressure (e.g., predetermined vibration and pressure) are applied to the semiconductor chip 100 through the head part 420, causing friction between the connection pads 212 and the bumps 120. For example, friction may occur between the connection pads 212 and the bumps 120 due to the high-speed vibration, for example, in the ultrasonic range (U/S), applied to the semiconductor chip 100. The surfaces of the connection pads 212 and the bumps 120 melt due to the generated friction. For example, the protrusions 122 provided on the surfaces of the bumps 120 melt due to the friction energy and at least portions of the surfaces of the connection pads 212, for example, the second conductive layers 212b may also melt. Therefore, the first metal included in the connection pads 212 and the second metal included in the bumps 120 are mixed between the connection pads 212 and the bumps 120 and, after the vibration and the pressure are removed, harden to form the conductive connection layer 300 illustrated in FIG. 8. For example, the conductive connection layer 300 may be formed as a mixture of the first metal and the second metal.

As described above, according to some embodiments of the present invention, the semiconductor chip 100 is mounted on the first substrate 210 by directly connecting the connection pads 212 and the bumps 120 to each other by using ultrasonic vibration (U/S) (e.g., by using vibration in the ultrasonic range). Therefore, the semiconductor chip 100 may be stably connected to the connection pads 212 of the first substrate 210 without using an ACF.

During the initial process of the connection process, pressure is concentrated on the protrusions 122 due to the plurality of protrusions 122 and concave portions 124 being formed on the surfaces of the bumps 120. Therefore, the bumps 120 may be easily connected to the connection pads 212 even using a relatively low-pressure process.

As described above, according to some embodiments of the present invention, the plurality of protrusions 122 and concave portions 124 are formed on the surface of each of the bumps 120 such that, during the initial stage of the connection process, pressure is concentrated at the protrusions 122 and the friction energy is amplified, such that the protrusions 122 may be easily melted without applying relatively high-pressure and a diffusion layer may be easily formed between the bumps 120 and the connection pads 212 corresponding thereto.

For example, when the same or substantially the same load is applied to a semiconductor chip 100 according to an embodiment of the present invention and to a comparative semiconductor including bumps that do not have concave portions, the bumps 120 of the semiconductor chip 100 according to the embodiment of the present invention having the protrusions 122 may be more easily melted than the bumps of the comparative semiconductor. Because the protrusions 122 may be easily melted even by a relatively low-pressure process, it is possible to prevent or reduce the risk of the wiring lines or the connection pads 212 of the electronic device being damaged. According to some embodiments of the present invention, for example, the semiconductor chip 100 may be stably connected to the display panel 200 by applying relatively low-pressure to the flexible display panel 200 when the first and second substrates 210 and 220 thereof are flexible plastic substrates.

In addition, when the protrusions 122 melt and combine or mix with the surfaces of the connection pads 212, a diffusion layer begins to form, and then the diffusion layer hardens to form the conductive connection layer 300 between the bumps 120 and the connection pads 212 corresponding thereto in the form of surface contact therebetween. When the plurality of protrusions 122 and concave portions 124 are on the surface of each of the bumps 120, friction between the bumps 120 and the connection pads 212 is amplified. Therefore, in comparison with a comparative semiconductor device including bumps that do not have the concave portions, even using the same pressure or a relatively low pressure, a higher quality conductive connection layer 300 may be formed in the semiconductor device according to embodiments of the present invention. And, although each of the bumps 120 has a fine width and/or a fine pitch of, for example, about 5 μm to about 20 μm, a stable connection structure may be provided between the bumps 120 and the connection pads 212. In addition, the direct connection structure between the bumps 120 and the connection pads 212 may provide a relatively low-resistance connection.

Example embodiments of the present invention have been disclosed herein, and although specific terms are employed, they are used and are to be interpreted in a generic and descriptive sense only and not for purpose of limitation. In some instances, as would be apparent to one of ordinary skill in the art as of the effective filing date of the present application, features, characteristics, and/or elements described in connection with a particular embodiment may be used singly or in combination with features, characteristics, and/or elements described in connection with other embodiments unless otherwise specifically indicated. Accordingly, it will be understood by those of ordinary skill in the art that various changes in form and details may be made to the described embodiments without departing from the spirit and scope of the present invention as set forth in the following claims and their equivalents.

What is claimed is:
1. A semiconductor chip comprising:
a base substrate;
a conductive pad on one surface of the base substrate;
an insulating layer on the one surface of the base substrate and having a plurality of first openings and a second opening exposing a portion of the conductive pad, the insulating layer extending from an edge of and at a same level as the conductive pad to over an upper surface of the conductive pad; and
a bump extending over the exposed portion of the conductive pad and over an upper surface of the insulating layer around the first openings and the second opening, the bump comprising a plurality of concave portions depressed from an upper surface of the bump, the concave portions respectively corresponding to the first openings and the second opening and being arranged in a longitudinal direction of the bump,
wherein the first openings are arranged on one line in the longitudinal direction of the bump, and wherein the second opening extends in the longitudinal direction of the bump in a bump area of the base substrate corresponding to the bump and extends between and opens to a plurality of the first openings.

2. The semiconductor chip of claim 1, wherein each of the first openings extends in a direction crossing the longitudinal direction of the bump.

3. The semiconductor chip of claim 1, wherein the bump comprises a metal layer.

4. The semiconductor chip of claim 1, further comprising a conductive medium layer between the conductive pad and the bump.

5. The semiconductor chip of claim 1, wherein the bump has a width of 5 μm to 20 μm, and
wherein each of the concave portions has a depth of 1 μm to 4 μm.

6. The semiconductor chip of claim 1, wherein the insulating layer comprises an inorganic layer and an organic layer.

7. The semiconductor chip of claim 1, wherein each of the concave portions has a depth corresponding to a height of the insulating layer.

8. An electronic device comprising:
a substrate comprising a plurality of connection pads on the substrate, the connection pads comprising:
a first conductive layer;
a second conductive layer on the first conductive layer; and
a protective layer between the first and second conductive layers, the protective layer having a plurality of second openings therein corresponding to the first conductive layer, the second conductive layer having a recessed portion corresponding to at least one of the second openings, the connection pads comprising a first metal;
a semiconductor chip comprising:
a base substrate;
a plurality of bumps arranged to respectively face the connection pads, electrically connected to the connection pads, and comprising a second metal;
a plurality of conductive pads arranged to face and respectively correspond to the bumps on one surface of the base substrate and electrically connected to the corresponding bumps; and
an insulating layer on the one surface of the base substrate and between the bumps and the conductive pads such that the bumps extend over an upper surface of the insulating layer, the insulating layer having a plurality of first openings arranged on one line in a longitudinal direction of each of the bumps and a second opening extending the longitudinal direction of each of the bumps, the first openings extending in a direction crossing the longitudinal direction, the second opening corresponding to one of the bumps being open to a plurality of the first openings corresponding to the one of the bumps; and
a conductive connection layer between the connection pads and the bumps and comprising a mixture of the first metal and the second metal,
wherein each of the bumps comprises a plurality of concave portions depressed from an upper surface thereof, the concave portions respectively corresponding to the first openings and the second opening in the insulating layer corresponding to the bump.

9. The electronic device of claim 8, further comprising a display panel comprising the substrate.

10. A method of connecting a semiconductor chip to an electronic device, the method comprising:
arranging the semiconductor chip over a substrate of the electronic device such that bumps on the semiconductor chip face connection pads on the substrate, the semiconductor chip comprising a plurality of conductive pads on a base substrate, an insulating layer on the conductive pads and having a plurality of first openings and a second opening, the first openings and the second opening exposing respective portions of the conductive pads, and a plurality of the bumps, each of the first openings extending in a direction crossing a longitudinal direction of the bumps, the second opening extending in the longitudinal direction of the bumps in a bump area of the base substrate corresponding to the bumps and extending between and opening to a plurality of the first openings, each of the bumps extending over at least one of the exposed portions of the conductive pads and over an upper surface of the insulating layer around the exposed portion and having a plurality of protrusions and concave portions in a longitudinal direction, the insulating layer extending from an edge of and at a same level as the conductive pad to over an upper surface of the conductive pad; and
connecting the bumps to corresponding ones of the connection pads by applying vibration and pressure to the semiconductor chip.

11. The method of claim 10, wherein the connecting of the bumps and the connection pads comprises:
melting portions of the protrusions and the connection pads by friction by applying ultrasonic vibration to the semiconductor chip; and
forming a conductive connection layer comprising a mixture of a metal of the bumps and a metal of the connection pads between the bumps and the connection pads.

* * * * *